US010090236B2

(12) United States Patent
Jayasena et al.

(10) Patent No.: US 10,090,236 B2
(45) Date of Patent: Oct. 2, 2018

(54) INTERPOSER HAVING A PATTERN OF SITES FOR MOUNTING CHIPLETS

(71) Applicant: Advanced Micro Devices, Inc., Sunnyvale, CA (US)

(72) Inventors: Nuwan S. Jayasena, Sunnyvale, CA (US); David A. Roberts, Santa Cruz, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 186 days.

(21) Appl. No.: 14/995,002

(22) Filed: Jan. 13, 2016

(65) Prior Publication Data

US 2017/0200672 A1  Jul. 13, 2017

(51) Int. Cl.
*H01L 23/498*  (2006.01)
*H01L 21/48*   (2006.01)
(Continued)

(52) U.S. Cl.
CPC .... *H01L 23/49838* (2013.01); *H01L 21/4853* (2013.01); *H01L 23/145* (2013.01);
(Continued)

(58) Field of Classification Search
CPC ......... H01L 24/97; H01L 24/04; H01L 24/06; H01L 24/80; H01L 21/4853;
(Continued)

(56) References Cited

U.S. PATENT DOCUMENTS

2002/0003232 A1   1/2002  Ahn
2006/0120668 A1   6/2006  Iwasaki
(Continued)

FOREIGN PATENT DOCUMENTS

KR   10-2014-0083657   7/2014

OTHER PUBLICATIONS

Rik Myslewski, "Intel, Sun vet births fast, inexpensive 3D chip-stacking breakthrough," www.theregister.co.uk/2014/02/21/thruchip_communications_comes_up_with_alternative_to_through_silicon_vias/, Feb. 21, 2014, last accessed on Feb. 10, 2016.
(Continued)

*Primary Examiner* — Joseph C Nicely
(74) *Attorney, Agent, or Firm* — Park, Vaughan, Fleming & Dowler LLP (57) ABSTRACT

The described embodiments include an interposer with signal routes located therein. The interposer includes a set of sites arranged in a pattern, each site including a set of connection points. Each connection point in each site is coupled to a corresponding one of the signal routes. Integrated circuit chiplets may be mounted on the sites and signal connectors for mounted integrated circuit chiplets may coupled to some or all of the connection points for corresponding sites, thereby coupling the chiplets to corresponding signal routes. The chiplets may then send and receive signals via the connection points and signal routes. In some embodiments, the set of connection points in each of the sites is the same, i.e., has a same physical layout. In other embodiments, the set of connection points for each site is arranged in one of two or more physical layouts.

18 Claims, 6 Drawing Sheets

(51) Int. Cl.
- *H01L 23/14* (2006.01)
- *H01L 23/15* (2006.01)
- *H01L 25/065* (2006.01)
- *H01L 25/00* (2006.01)

(52) U.S. Cl.
CPC ............ *H01L 23/147* (2013.01); *H01L 23/15* (2013.01); *H01L 25/0652* (2013.01); *H01L 25/0655* (2013.01); *H01L 25/50* (2013.01); *H01L 2224/16145* (2013.01); *H01L 2224/16227* (2013.01); *H01L 2224/8114* (2013.01); *H01L 2224/81139* (2013.01); *H01L 2225/06513* (2013.01); *H01L 2225/06531* (2013.01); *H01L 2225/06534* (2013.01); *H01L 2225/06589* (2013.01); *H01L 2225/06593* (2013.01); *H01L 2924/1431* (2013.01); *H01L 2924/1432* (2013.01); *H01L 2924/1433* (2013.01); *H01L 2924/1434* (2013.01); *H01L 2924/1436* (2013.01); *H01L 2924/157* (2013.01); *H01L 2924/1579* (2013.01); *H01L 2924/15192* (2013.01); *H01L 2924/15311* (2013.01); *H01L 2924/15787* (2013.01); *H01L 2924/19041* (2013.01); *H01L 2924/19043* (2013.01); *H01L 2924/19105* (2013.01)

(58) Field of Classification Search
CPC ............ H01L 23/49838; H01L 23/538; H01L 23/145; H01L 23/147; H01L 23/15; H01L 25/0652; H01L 25/0655
See application file for complete search history.

(56) References Cited

U.S. PATENT DOCUMENTS

| | | | |
|---|---|---|---|
| 2007/0200257 A1 | 8/2007 | Chow | |
| 2009/0289348 A1* | 11/2009 | Tang | H01L 23/50 257/697 |
| 2013/0009316 A1 | 1/2013 | Wang | |
| 2013/0062760 A1* | 3/2013 | Hung | H01L 21/561 257/738 |
| 2014/0042643 A1* | 2/2014 | Yu | H01L 21/486 257/777 |
| 2016/0064319 A1* | 3/2016 | Suzuki | H01L 23/49827 174/251 |
| 2017/0103943 A1* | 4/2017 | Hu | H01L 23/49838 |
| 2017/0229401 A1* | 8/2017 | Chiu | H01L 23/562 |
| 2017/0250150 A1* | 8/2017 | Konchady | H01L 23/5389 |
| 2017/0256525 A1* | 9/2017 | Magnus | H01L 25/16 |

OTHER PUBLICATIONS

Natalie E. Jerger, et al., "NoC Architectures for Silicon Interposer Systems," Microarchitecture (Micro), 2014 47th Annual IEEE/ACM International Symposium on Microarchitecture, Dec. 2014, pp. 458-470.

* cited by examiner

INTERPOSER HAVING A PATTERN OF SITES FOR MOUNTING CHIPLETS

BACKGROUND

Field

The described embodiments relate to interposers. More specifically, the described embodiments relate to interposers having patterns of sites for mounting integrated circuit chiplets.

Related Art

Multi-chip integration, in which two or more integrated circuit chips are enabled to interoperate with one another, is a design challenge that designers have faced for a number of years. Several techniques have been proposed for multi-chip integration, such as using multi-chip modules, systems in a package (SiP), and 3-dimensional chip stacking. Although existing techniques generally enable multi-chip integration, the existing techniques have shortcomings in terms of power consumption, complexity of design, proprietary/custom elements, and/or inadequate performance. Multi-chip integration therefore remains a challenge.

BRIEF DESCRIPTION OF THE FIGURES

Throughout the figures and the description, like reference numerals refer to the same figure elements.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the scope of the described embodiments. Thus, the described embodiments are not limited to the embodiments shown, but are to be accorded the widest scope consistent with the principles and features disclosed herein.

Overview

The described embodiments include an interposer with signal routes located therein. A surface of the interposer includes a set of sites arranged in a pattern, each site including a set of connection points (i.e., electrically conductive connection points, electromagnetic connection points, etc.). Each connection point in each site is coupled to a corresponding one of the signal routes. Integrated circuit chiplets may be mounted on the sites and coupled to some or all of the connection points for the sites, thereby coupling the chiplets to corresponding signal routes. The chiplets may then send and receive signals (data signals, control signals, power/ground, etc.) via the connection points and signal routes.

In some embodiments, the set of connection points in each of the sites is the same, i.e., has a same physical layout. In these embodiments, because the connection points in each site are the same, a chiplet that can be coupled to one of the sites can be interchangeably coupled to any of the sites. In other embodiments, the set of connection points for each site is arranged in one of two or more physical layouts (i.e., two or more subsets of the sites have different layouts of connection points). In some of these embodiments, the sites with each of the two or more physical layouts are arranged in a pattern (e.g., a uniform pattern, a repeating pattern, etc.). For example, sites may alternate between a first layout (of connection points) and a second layout in a checkerboard pattern, sites in a particular region (row, physical area, etc.) may have a first layout while sites in a neighboring region have a second layout, etc.

In some embodiments, the interposer includes circuit elements coupled to the connection points for some or all of the sites and/or coupled to corresponding signal routes. For example, in some embodiments, the interposer includes one or more of: network processing circuits (switches, routers, etc.), repeater circuits, processing circuits, discrete elements (capacitors, resistors, etc.), and/or other circuit elements. In these embodiments, the circuit elements are configured to interoperate with the chiplets mounted on the sites (i.e., perform operations based on signals, data, etc. received from or destined for the chiplets).

Because the interposer has the pattern of sites for mounting the chiplets, each site having a particular layout of connection points, chiplet producers (designers, manufacturers, etc.) are able to produce chiplets with standardized physical interfaces. The producers may therefore focus on designing the chiplets, rather than expending design effort on an interposer and/or customized chiplet interfaces. This in turn enables improved multi-chip integration by enabling semi-custom chiplet-interposer systems, reduced time to market for chiplets and the interposer, integration of multiple process sites, silicon-intellectual property (IP) reuse, etc.

Chiplets

As described above, the described embodiments include an interposer on which chiplets may be mounted. Generally, chiplets include any type of chip, packaged device, module, etc. that can be mounted on the interposer as described herein. In some embodiments, the chiplets are configured with integrated circuits and/or other circuit elements. For example, in some embodiments, chiplets include computational logic such as central processing units (CPUs) and graphics processing units (GPUs); application specific integrated circuits (ASICs); caches and cache controllers; co-processors or computational accelerator blocks; programmable logic such as field programmable gate arrays (FPGAs); volatile or non-volatile memory modules; scratch-pad modules (e.g., addressable low-latency temporary data stores); network traffic processing circuits such as controllers, shapers, filters, and routers/switches; analog circuit components such as cellular or Wi-Fi elements; discrete circuit elements such as capacitors, resistors, etc.; sensors/sensor arrays; media processors; and/or other circuit elements. In some embodiments, chiplets include active or passive mechanical components such as cooling/insulating inserts; heating inserts; physical spacers; light sources; external signal (e.g., network, data bus, etc.) connectors or interfaces; inter-chip sockets; and/or other components.

In describing chiplets being mounted to an interposer herein, it is intended that the term "chiplet" be understood as not being limited to a bare semiconductor chip, but also covers a package in which the chip is contained. In addition, as described above, some "chiplets" do not include a semiconductor chip or include a semiconductor chip along with other elements. For such "chiplets" the term is simply used for convenience. Generally, chiplet, as used herein, means an element that is to be mounted on an interposer.

Interposer

Figure 1:
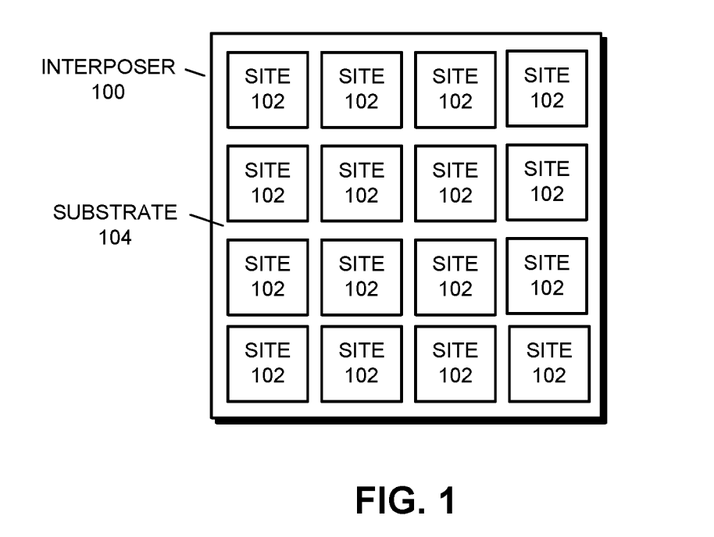
FIG. 1 presents a block diagram illustrating an interposer in accordance with some embodiments.
Figure 2:
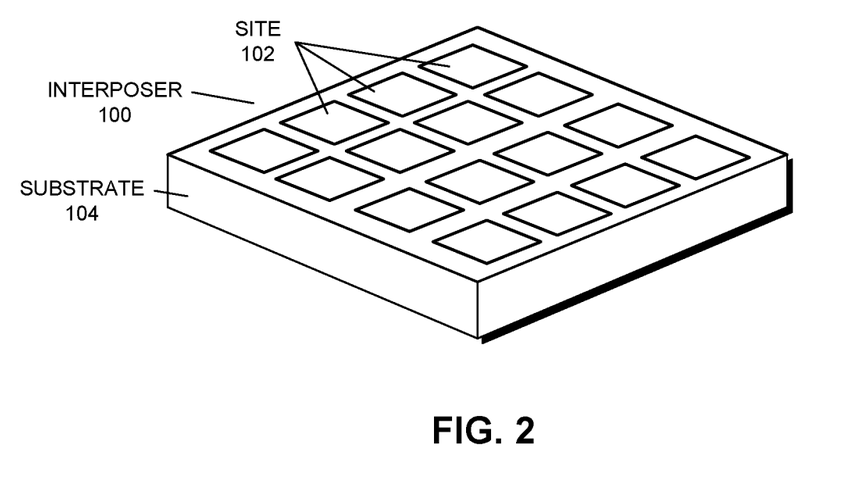
FIG. 2 presents an isometric view of an interposer in accordance with some embodiments.

FIG. 1 presents a block diagram illustrating interposer 100 in accordance with some embodiments. FIG. 2 presents an isometric view of interposer 100 in accordance with some embodiments. Generally, interposer 100 is a device that provides a number of sites 102. Chiplets may be mounted on sites 102 to enable the chiplets to interoperate, via interposer 100, with one another and/or interposer 100.

As can be seen in FIG. 1, interposer 100 includes substrate 104. Substrate 104 is fabricated from one or more pieces of material such as a semiconductor material, a plastic material, a ceramic or glass material, and/or another material. In some embodiments, the material from which substrate 104 is fabricated is selected to enable signal routes (for, e.g., electrical signals, electromagnetic signals, etc.) to be located in or on substrate 104. For example, in some embodiments, substrate 104 is wholly or partially fabricated from a material having properties of an electrical insulator. Additionally, in some embodiments, circuit elements are formed/fabricated and/or otherwise located in substrate 104.

Figure 3:
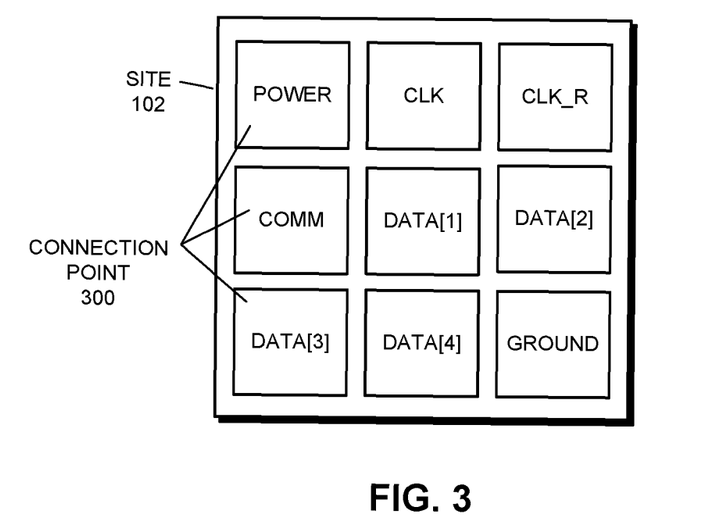
FIG. 3 presents a block diagram illustrating a site in accordance with some embodiments.

Sites 102 are regions of substrate 104 that are characterized at least in part by having a set of connection points in a corresponding layout. FIG. 3 presents a block diagram illustrating a site 102 in accordance with some embodiments. As can be seen in FIG. 3, site 102 includes nine square connection points 300 (for clarity only the leftmost three connection points 300 are labeled as such). The connection points 300 in site 102 in FIG. 3 include power and ground, which are electrical power and ground connections, clock ("CLK") and clock_r ("CLK_R"), which are a clock and a redundant/backup clock, communication ("COMM"), which is a network communication control, and data[1]-data[4], which are individual data connections. Each connection point includes one or more electrical, electromagnetic, and/or other mechanism for coupling signal connectors for a chiplet mounted on the site to corresponding signal routes in interposer 100. For example, in some embodiments, connection points 300 comprise conductive connection mechanisms (e.g., solder bumps, input-output pads, through-silicon vias (TSVs), sockets, etc.), inductive or capacitive connection regions, and/or other mechanisms.

In some embodiments, each site 102 on interposer 100 includes a same layout of connection points. For example, in some embodiments, each site includes the layout of connection points 300 shown in FIG. 3. In these embodiments, a chiplet that can be mounted on any one site 102 on interposer 100 can be interchangeably mounted on any other site 102. In other words, no matter which site 102 a chiplet is mounted on, the chiplet will be able to connect to the connection points in the site 102. In these embodiments, chiplets of different types can be designed with interfaces for connecting to the common connection point layout, thereby avoiding the need to customize the interface for the chiplet based on where the chiplet will be mounted on interposer 100 and/or customize the connection points for a site on interposer 100.

In some embodiments, each site on interposer 100 includes one of two or more layouts of connection points. For example, in some embodiments, a first layout of connection points includes the connection points 300 shown in FIG. 3, and a second layout of connection points includes a different arrangement of connection points, which may have a different number, placement, and/or type of connection points. For example, in some embodiments, the first layout of connection points includes connection points for a high-bandwidth or high-speed data interconnect (or a particular clock, extra power connection points, etc.) while the second layout includes connection points to a lower bandwidth or lower-speed interconnect. In these embodiments, chiplets of different types can be designed to connect to one of the two or more layouts of connection points, enabling some customization of chiplets (e.g., to enable the chiplet to access a bus having a particular bandwidth), but avoiding some of the need to customize the interface for the chiplet and/or interposer 100.

In embodiments where sites 102 on interposer 100 include one or two or more different layouts of connection points, sites 102 having different layouts may be located on interposer 100 in various ways. For example, in some embodiments, sites 102 in a leftmost column of sites 102 on interposer 100 include connection points with the above-described first layout and the remaining columns of sites 102 alternate between the second layout and the first layout, so that columns have alternating layouts. As another example, in some embodiments, the layout of connection points for sites 102 in predetermined locations (every other site 102, a one or more sites 102 in the middle of interposer 100, sites 102 on the corners of interposer 100, etc.) include connection points with the first layout and the remaining sites 102 have connection points with the second layout. As yet another example, in some embodiments, some sites 102 include connection points that connect to signal routes that are coupled to connection points for only a subset of the other sites 102, these connection points providing low-latency or high-bandwidth access (i.e., a high-speed connection) between the corresponding sites 102 and the subset of the other sites 102.

In some embodiments, some or all of the connection points are coupled to signal routes located (embedded, routed, etc.) within interposer 100. For example, in some embodiments, interposer 100 includes one or more electrically conductive (e.g., metal, etc.) traces, electromagnetic (e.g., optical, microwave, etc.) paths, and/or other signal routes fabricated in or on interposer 100. In these embodiments, a contact, waveguide, via, and/or other connector extends from each connection point to the corresponding signal route, forming an electrical, optical, mechanical, etc. connection between the connection point and the signal route through which corresponding signals can be communicated. For instance, the power connection point shown in FIG. 3 may connect through a contact or a via to a power rail in interposer 100, the data[1]-data[4] connection points may connect through a contact, a via, a waveguide, etc. to links of a corresponding data bus in interposer 100, etc.

Figure 4:
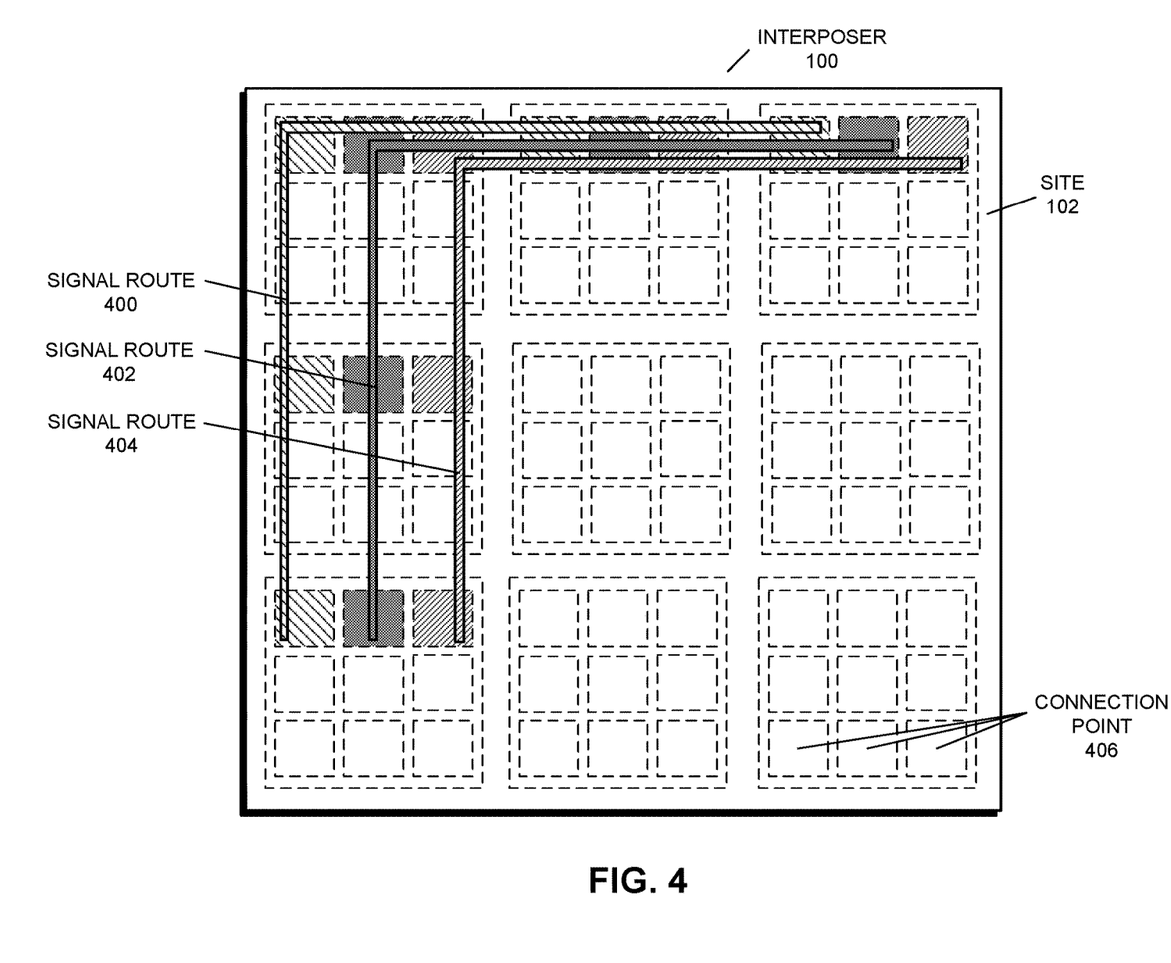
FIG. 4 presents a block diagram illustrating signal routes in an interposer in accordance with some embodiments.

FIG. 4 presents a block diagram illustrating signal routes in an interposer in accordance with some embodiments. In FIG. 4, a set of sites 102 on interposer 100 are shown with connection points 406 using dashed lines to avoid obscuring signal routes 400-404. (In FIG. 4, only the one of the sites 102 is labeled and only a few connection points 406 are labeled for clarity.) In addition, each of signal routes 400-404 and a set of connection points 406 to which each of signal routes 400-404 connects is shaded using a similar pattern. For example, signal route 400 and the corresponding connection points 406 (which are the top left connection points 406 in a subset of the sites 102) are shaded using a widely-spaced hash-mark pattern that leans left to right.

As can be seen in FIG. 4, signal route 400 runs between a top-left connection point 406 in sites along the top and left edges of interposer 100. In this embodiment, signal route 400 is connected to each of the corresponding connection points 406, which enables a same signal (e.g., a power signal, which is a steady signal at a specified voltage) to be provided to each of the corresponding connection points 406. In addition, signal route 402 runs between a top-middle connection point 406 in sites along the top and left edges of interposer 100. In this embodiment, signal route 402 is connected to each of the corresponding connection points 406, which enables a same signal (e.g., a clock signal) to be provided to each of the connection points 406 and/or to be sent from a given one of the connection points 406 to each of the other connection points 406 coupled to signal route 402. For example, in some embodiments, the chiplet mounted on the top right site 102 of interposer generates a clock signal that is provided, via signal route 402, to corresponding connection points 406 each of the other sites 102 to which signal route 402 is connected.

Although signal routes 400-404 are shown as being connected only to connection points 406 in sites 102 on the top and left edges of interposer 100, in some embodiments, each connection point 406 of a particular type (power, data, etc.) is connected, via a corresponding signal route, with other connection points 406 in at least some of the sites 102 in interposer 100. For example, in some embodiments, signal route 400, which may route a power signal, can be connected to at least one connection point 406 in each site 102 in interposer 100 to provide a corresponding signal to a chiplet mounted on each site 102. As another example, in some embodiments, data connection points 406 for each of the sites 102 are coupled together via corresponding signal routes (e.g., a network bus), thereby enabling a chiplet mounted in each of the sites 102 to communicate data/information to each of the other chiplets mounted on other sites on interposer 100. In some embodiments, the data connection points 406/signal routes form a network between some or all of the sites 102 (e.g., a ring, a mesh, a tree, and/or another network topology).

In some embodiments, all of the sites 102 have a same/matching layout of connection points 406. In some of these embodiments, corresponding signal routes are routed between each connection point 406, forming a grid, tree, etc. of signal routes for each type of connection point 406 (power, data, etc.). In some embodiments, however, subsets of the sites 102 have a different layout of connection points 406. In these embodiments, one or more signal routes are routed between connection points 406 of the same types.

As described above, in some embodiments, the signal routes form a network within interposer 100. In other words, the connection points 406 in some or all of the sites 102 include connection points 406 that are coupled to signal routes in interposer 100 that form a network for communicating between two or more sites 102. In these embodiments, some or all of the sites 102 are part of the network (ring, mesh, tree or other) and have an ID, and circuit elements in interposer 100 or circuits in the chiplets route communications on the network accordingly.

In some embodiments, some or all of sites 102 include one or more mechanisms for mounting chiplets to the site such as solder/adhesive pads or regions, mechanical connectors (sockets/plugs, receivers, clamps, screws, magnets, etc.), alignment mechanisms (guides, protrusions/depressions, etc.), and/or other mounting mechanisms.

Although interposer 100 is presented in FIGS. 1-4 (and other figures in the instant application) with a particular number and shape of sites 102, in some embodiments a different number of sites 102 and/or shape of sites 102 may be available on interposer 100. For example, sites 102 may be round, triangular, cross-shaped, etc. and be arranged in any corresponding pattern. In addition, although interposer 100 is shown in a rectangular shape, in some embodiments, interposer 100 is another shape. Also, although a particular number, arrangement, and shape of connection points is shown in FIG. 3, in some embodiments, a different number, arrangement, type, and/or shape of connection points is used. For example, in some embodiments, the connection points for some of the sites 102 include 64, 128, or another number of round-shaped memory system bus connection points.

Although FIG. 1 shows sites 102 that are the same size and shape, in some embodiments, sites 102 are more than one size and/or shape. For example, in some embodiments, the sites may be arranged in any uniform, and not necessarily repeating, pattern. For example, an outer perimeter of sites may have a first shape (e.g., rectangular, round, polygonal, etc.) while an inner region of sites has a second shape (e.g., L-shaped, square, round, triangular, etc.). As another example, in some embodiments, sites 102 include two or more shapes in a sub-pattern that is repeated in a main/overall pattern, such as an L-shaped site 102 wrapped on two sides of a square site 102, forming a square sub-pattern within a main pattern of squares. In some embodiments, two or more patterns of sites 102 may be present on interposer 100. For example, one or more of sites 102 are a different shape and form a different pattern than others of the sites 102. In these embodiments, any number of sites may have a particular shape and any number of other sites may have one or more other/different shapes. For example, in some embodiments, one or more sites may have a first shape and any remaining sites may have a second shape.

The interposer can be and/or can be used in any type of electronic device. For example, the interposer can be and/or be used in used in a desktop computer, a server computer, a smart phone, a toy, network equipment, audio/visual equipment (projectors, televisions, stereo receivers, etc.), vehicles (autos, trucks, boats, etc.), an industrial controller, a robot, and/or other electronic devices.

Chiplets Mounted on an Interposer

Figure 5:
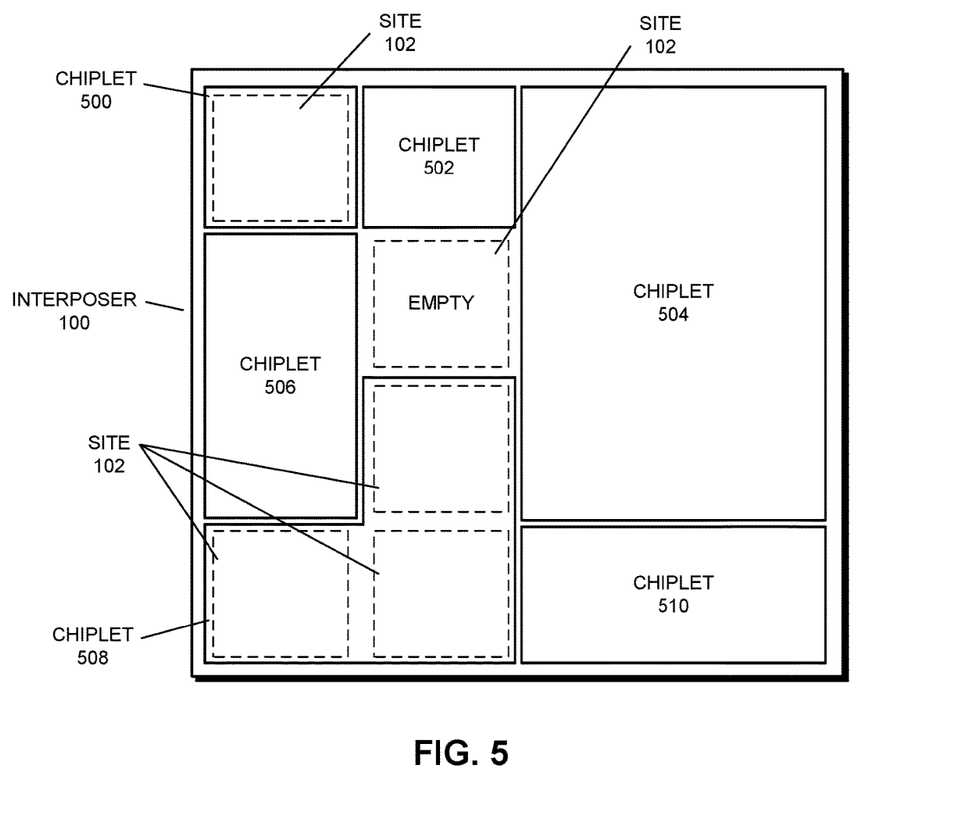
FIG. 5 presents a block diagram illustrating chiplets mounted on an interposer in accordance with some embodiments.

FIG. 5 presents a block diagram illustrating chiplets mounted on an interposer in accordance with some embodiments. For FIG. 5, only a few of the available sites 102 are shown for clarity; however, a four-by-four arrangement of sites 102 exists on interposer 100. In addition, although connection points are not shown in FIG. 5 for clarity, a set of connection points is available in each site 102 on interposer 100 as described above. For the example presented below, it is assumed that the connection points in each site 102 are the same as those shown in FIG. 3. Recall, however, that, in some embodiments, interposer 100 includes a different number, shape, and/or arrangement of sites 102 and/or connection points.

As can be seen in FIG. 5, chiplets 500-510 are mounted on sites 102 on interposer 100. Chiplets 500 and 502 are "one-by-one" chiplets, in that chiplets 500-502 are mounted on only a single site on interposer 100—and do not span multiple sites 102. Chiplets 500-502 may include one or more signal connectors that are coupled to connection points in the corresponding site 102. For example, in some embodiments, chiplet 500 includes a number of computational circuits and is coupled to each connection point in the corresponding site 102—so that power and ground signal connectors for chiplet 500 are coupled to corresponding connection points, data signal connectors for chiplet 500 are coupled to the data[1]-data[4] connection points, etc. Note, however, that, in some embodiments, some or all of the connection points in a given site may be unused (i.e., may not be coupled to signal connectors on a chiplet mounted on the site 102). For example, in some embodiments, chiplet 502 includes computational circuits, but uses an internally-generated clock, and therefore does not include signal connectors for clock and/or clock_r. As another example, in some embodiments, chiplet 502 is a thermal spacer without signal connectors, and therefore chiplet 502 does not connect to any of the connection points in the corresponding site 102.

Chiplets 504-510 are multi-site chiplets, in that chiplets 504-510 and/or chiplet packages span multiple sites 102 on interposer 100. For example, as shown in FIG. 5, chiplet 504 is a two-by-three chiplet that spans six sites 102, or for which a package spans the six sites 102, and chiplet 508 is an L-shaped two-by-one chiplet that spans three sites 102 in an irregular shape. Chiplets may span sites 102 for various reasons, including using more space for chiplet circuitry and/or packaging than is provided by one site, using more space for heating or cooling purposes, etc. In some embodiments, chiplets span sites 102 to enable the chiplets to use the additional connection points provided by additional sites 102. For example, assuming that chiplet 504 includes computational circuits or memory circuits that use more power than is to be provided by a single power connection point, chiplet 504 can span multiple sites to enable chiplet 504 to use power connection points in each of the multiple sites. As another example, assuming that chiplet 504 includes networking circuits that use more bandwidth (e.g., wider bus, higher data speed, etc.) than is provided by the networking connection points in a single site, chiplet 504 can span multiple sites to enable chiplet 504 to use network connection points in each of the multiple sites. As described above, chiplet 504 may or may not use all connection points in the various sites 102.

Note that one site 102 is empty. In some embodiments, a chiplet need not be mounted on every site or all of a particular site in order for interposer 100 and/or chiplets mounted thereto to operate. For example, in some embodiments, partial coverage of sites 102 is permitted. In these embodiments, for example, chiplet 502 may be extended to cover part of the empty site 102—and signal connectors in chiplet 502 may be connected to corresponding connection points in the site 102.

In some embodiments, stacks of chiplets are coupled to interposer 100. For example, DRAM memory chips may be stacked and communicatively coupled to one another (via TSVs, inductive or capacitive communication, etc.), and the stack of DRAM memory chips may be mounted on one or more sites on interposer 100. In these embodiments, the stacks of chiplets are configured to use interposer 100 as described herein.

As described above, although FIG. 5 shows sites 102 that are the same size and shape, in some embodiments, sites 102 are more than one size and/or shape. For example, in some embodiments, the sites may be arranged in any uniform, and not necessarily repeating, pattern. As another example, in some embodiments, two or more patterns of sites 102 may be present on interposer 100. In these embodiments, and as described above, chiplets may be mounted to corresponding sites 102 on interposer 100.

Circuit Elements in the Interposer

Figure 6:
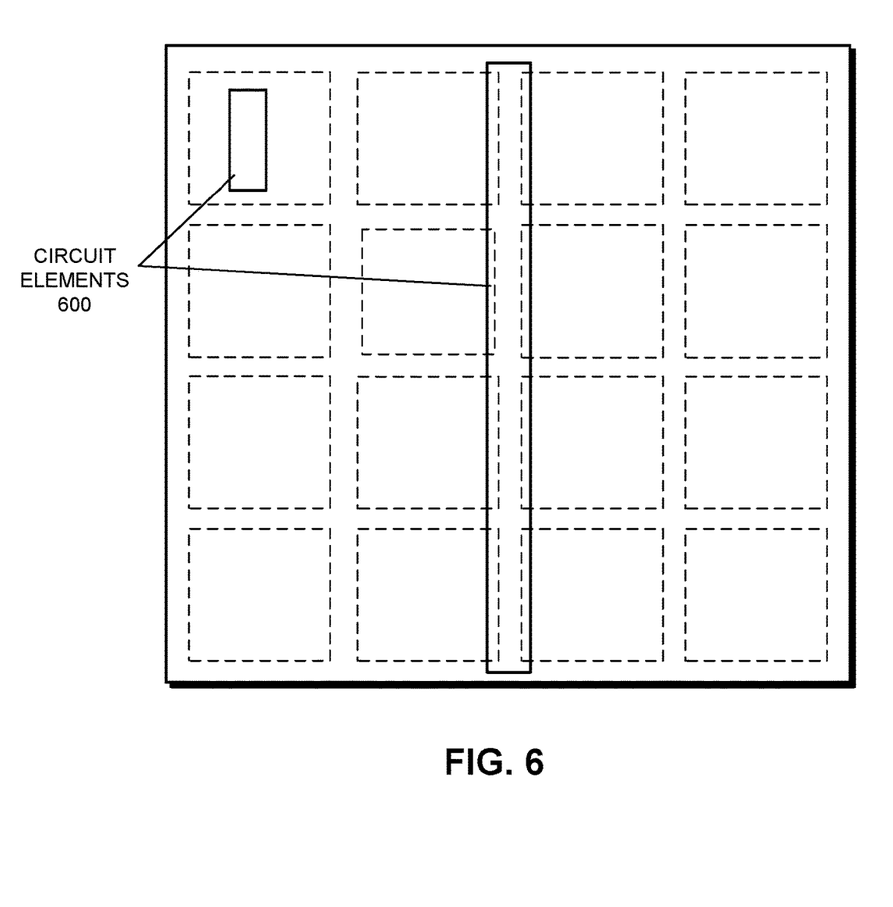
FIG. 6 presents a block diagram illustrating circuit elements in an interposer in accordance with some embodiments.

In some embodiments, interposer 100 includes active or passive circuit elements that interoperate with chiplets mounted on some or all of sites 102. FIG. 6 presents a block diagram illustrating circuit elements 600 in interposer 100 in accordance with some embodiments. In FIG. 6, a number of sites 102 are shown using dashed lines to avoid obscuring circuit elements 600 and, for clarity, connection points are not shown.

In some embodiments, circuit elements 600 are coupled to one or more connection points for some or all of sites 102 and/or coupled to corresponding signal routes. The circuit elements may include any circuit elements that can interoperate with chiplets, such as networking circuits, repeater circuits, processing circuits, discrete elements (capacitors, resistors, etc.), and/or other circuit elements. As used herein "interoperating" means to acquire signals, data, etc. from chiplets and perform one or more operations based at least in part on the signals, data, etc. For example, the circuit elements may perform computational operations, signal repeating, scaling or routing, logical or bitwise operations, digital signal processing, protocol conversions, differential signal handling, etc. on signals, data, etc. received from and/or destined for chiplets.

As described above, in some embodiments, some of the signal routes in interposer 100 form a network in interposer 100. For example, the signal routes may form bits, lines, or links of a bus for which corresponding network techniques (addressing, packetizing, etc.) are used for exchanging communications between mounted chiplets and/or the interposer. In some of these embodiments, circuit elements 600 include some or all of the network processing circuits (switches, routers, etc.) that handle communications on the network. For example, the network processing circuits may receive communications from a chiplet mounted on a first site 102, may process (partition, packetize, etc.) the communication from the chiplet mounted in the first site 102, and may forward the processed communication to a chiplet mounted in a second site 102. In some of these embodiments, one or both chiplets may not include network processing circuits—and may even be unaware that a network is used for forwarding communications (i.e., may not be configured to communicate using the network). In others of these embodiments, one or both chiplets have some or all of the network processing circuits and the network processing circuits in interposer 100 may simply forward communications received from the chiplets with or without further processing.

In some embodiments, the circuit elements in interposer 100 include processing circuits that receive, at a predetermined ID or address, commands or requests from chiplets configure interposer 100, such as configuring network routing parameters, power parameters, etc. for interposer 100. In these embodiments, chiplets are aware of interposer 100 (i.e., include processing circuits configured to interact with interposer 100) and can interact with the circuit elements in interposer 100 to configure interposer 100 to perform certain operations, set environmental variables (power, voltage, clock frequency, bus speeds, etc.) to specified levels, etc.

In some embodiments in which interposer 100 includes circuit elements and/or signal routes for a network, chiplets may use the network in various ways. For example, in some embodiments, chiplets communicate information using only a single site. In these embodiments, circuit elements in interposer 100 can switch/route packets or other network communications from the chiplet back to the chiplet over corresponding signal connections for the chiplet.

Manufacturing an Interposer

In the described embodiments, interposer 100 is created in a number of operations during a manufacturing process. The specifics of the manufacturing process used for manufacturing interposer 100 depend on the material(s) (semiconductor, plastic, ceramic or glass, etc.) from which substrate 104 is formed. In the following manufacturing example, a manufacturing process is described in which substrate 104 is formed from a semiconductor material.

Figure 7:
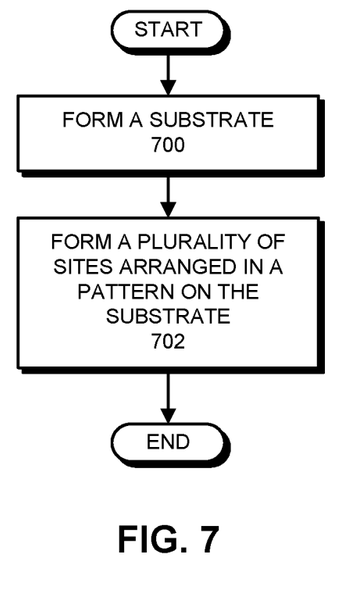
FIG. 7 presents a flowchart illustrating a process for manufacturing an interposer in accordance with some embodiments.

FIG. 7 presents a flowchart illustrating a process for manufacturing interposer 100 in accordance with some embodiments. Note that the operations shown in FIG. 7 are presented as a general example of operations performed by some embodiments. The operations performed by other embodiments include different operations and/or operations that are performed in a different order. Additionally, although certain mechanisms/elements are used in describing the operations (e.g., interposer 100, substrate 104, etc.), in some embodiments, other mechanisms perform the operations and/or the operations are performed on other mechanisms/elements.

As shown in FIG. 7, the manufacturing process includes forming substrate 104 (step 700). In some embodiments, this operation includes forming a semiconductor material using known techniques such as melting or combining input material(s) and forming blocks of semiconductor material therefrom, doping the semiconductor material, etc. When forming the substrate, signal routes are formed in the substrate. Depending on the type of signal route (electrical, electromagnetic, etc.), various known techniques may be used for forming the signal routes. For example, for electrical/conductive material (e.g., metal) signal routes, the forming may include operations such as conductive material deposition, etching and filling routes, etc. As another example, for electromagnetic (e.g., optical) signal routes, the forming may include creating signal paths/waveguides in the substrate, etc.

The manufacturing process also includes forming a plurality of sites 102 arranged in a pattern on the substrate (step 702). In some embodiments, this operation includes forming the individual sites by, for example, forming depressions/recessions into which chiplets fit, forming one or more mounting or guiding elements (protrusions/depressions, fasteners, etc) in or on the substrate, forming an area for each site to which a bonding adhesive can be applied to adhere a mounted chiplet to site 102, etc. In some embodiments, however, the sites, aside from connection points, do not have substantial variation from the rest of substrate 104 (i.e., may simply be physical regions of substrate 104, each of which includes a set of connection points).

In some embodiments, the sites are arranged in a "uniform" pattern on interposer 100, so that there is at least some regularity in placement of sites of particular shapes and/or sets of connection points. In some embodiments, there is more than one uniform pattern and/or more than one shape of sites. For example, an outer perimeter of sites may have a first shape (e.g., rectangular, round, polygonal, etc.) while an inner region of sites has a second shape (e.g., l-shaped, round, triangular, etc.). In these embodiments, any number of sites may have a particular shape and any number of other sites may have one or more other/different shapes. For example, in some embodiments, one or more sites may have a first shape and any remaining sites may have a second shape.

When forming the sites and/or when forming the substrate, a set of connection points is formed in each of the sites. Depending on a type of the corresponding signal routes (electrical, electromagnetic, etc.), various known techniques may be used for forming the connection points. For example, for electrical/conductive material signal routes, forming the connection points may include operations such as conductive material deposition, etching or drilling, forming conductive pads on the surface of interposer 100, etc. As another example, for electromagnetic signal routes, the forming may include etching or otherwise creating signal paths/waveguides, forming electromagnetic receiving regions on the surface of interposer 100, etc. The set of connection points in each of the sites is coupled to one or more of the signal routes in the substrate by physically coupling, using a via, waveguide, etc., the connection points with a corresponding signal route. For example, a signal route such as signal route 402 may be electrically, optically, etc. coupled to corresponding connection points in a plurality of sites 102.

As described herein, the set of connection points in each of the sites is arranged in one of one or more layouts. In some embodiments, each of the sites has a same set of connection points, and forming the set of connection points in each of the sites includes forming matching sets of connection points in each site. In these embodiments, each connection point in a same location in each of the sites is coupled to a same type of signal route in the substrate. For example, a power connection point in a given location in each site may be coupled to one of one or more power rails (power signal routes) in interposer 100.

In other embodiments, the connection points in each site are arranged in one of two or more different layouts, so that matching layouts of the set of connection points are repeated in two or more subsets of the sites. For example, in some embodiments, interposer 100 may have a subset of sites 102 that include connection points to a high-speed or high-bandwidth bus for communicating between corresponding sites 102, with the remaining sites having connection points for a slower bus and/or no bus connection. As another example, in some embodiments, a subset of sites 102 may have more connection points for power and/or ground so that chiplets that have corresponding power requirements may be mounted in these sites 102.

In some embodiments, when forming substrate 104, one or more circuit elements is formed in the substrate 104. Depending on the material used for substrate 104, various known techniques may be used for forming the circuit elements. For example, when substrate 104 is formed from a semiconductor material, operations such as material deposition, etch and fill, etc. may be used to form integrated circuits or discrete circuit elements (resistors, capacitors, etc.) in substrate 104. As another example, when substrate is formed from ceramic, plastic, etc. various circuit elements can be placed in substrate 104 as substrate 104 is formed.

Mounting Chiplets to an Interposer

In the described embodiments, chiplets can be mounted on interposer 100. Generally, in "mounting" chiplets on interposer 100, the chiplets are fixedly/permanently or removably/temporarily coupled to interposer 100 in such a way that chiplets are enabled to perform one or more operations using, for, and/or with interposer 100. For example, a mounted chiplet may use signal routes in interposer 100 to exchange signals, data, etc. with other chiplets mounted on interposer 100, with interposer 100 itself (e.g., to circuit elements in interposer 100), and/or with an external device coupled to interposer 100. As another example, a mounted heat sink chiplet may absorb heat from interposer 100, from other chiplets mounted on interposer 100, and/or from a device external to interposer 100.

Figure 8:
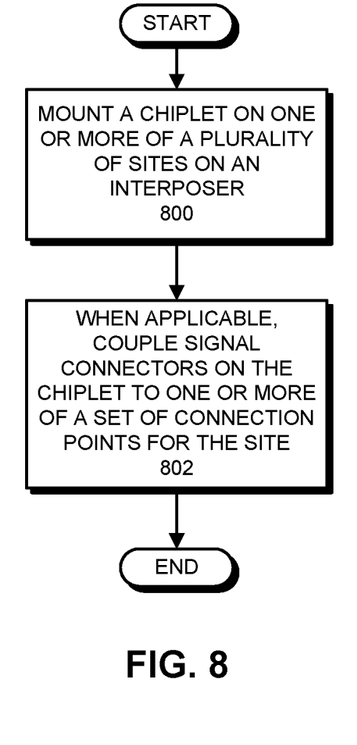
FIG. 8 presents a flowchart illustrating a process for mounting a chiplet to an interposer in accordance with some embodiments.

FIG. 8 presents a flowchart illustrating a process for mounting a chiplet to interposer 100 in accordance with some embodiments. Note that the operations shown in FIG. 8 are presented as a general example of operations performed by some embodiments. The operations performed by other embodiments include different operations and/or operations that are performed in a different order. Additionally, although certain mechanisms/elements are used in describing the operations (e.g., interposer 100, etc.), in some embodiments, other mechanisms perform the operations and/or the operations are performed on other mechanisms/elements.

As can be seen in FIG. 8, the process includes mounting a chiplet to one or more of a plurality of sites 102 arranged in a pattern on a surface of the interposer (step 800). In the described embodiments, each of the sites 102 comprises a set of connection points coupled to one or more signal routes in the substrate, the set of connection points in each of the sites being arranged in one of one or more layouts. For example, the connection points in each of the sites may be arranged in a same layout, so that a matching layout of the set of connection points is repeated in each of the sites. Alternatively, the connection points in each of the sites may be arranged in one of two or more different layouts, so that matching layouts of the set of connection points are repeated in two or more subsets of the sites.

In some embodiments, and depending on the type of chiplet, when mounting the chiplet to the one or more of the plurality of sites 102, one or more signal connectors for the chiplet are coupled to one or more corresponding connection points in the site 102 (step 802). For example, when the chiplet has a power signal connector that is to be coupled to the interposer, the power signal connector can be coupled to a power connection point in the site. As another example, when the chiplet has one or more signal connectors for a data bus, the signal connectors for the data bus can be coupled to data connection points in the site 102. "Coupled" as used here means that the signal connectors on the chiplet are directly or indirectly electrically, electromagnetically, etc. connected to the connection points, such as by soldering, bonding, etc., for connection points where physical/mechanical connection points are used, by aligning or placing proximate to communication regions for electromagnetic connection points (optical, capacitive, etc.), etc.

In some embodiments, mounting the chiplet means fixedly/permanently attaching the chiplet to interposer 100, such as by bonding with a chemical adhesive, soldering, etc. the chip in such a way as removal of the chiplet from interposer 100 is not intended—and may be difficult or impossible without damaging the chiplet and/or interposer 100. In some embodiments, mounting the chiplet means removably/temporarily attaching the chiplet to interposer 100, such as by bonding with a reversible chemical adhesive, soldering, clamping/fastening, etc. the chip in such a way as removal of the chiplet from interposer 100 is intended, such as temporarily fastening a memory chiplet to interposer 100 that is intended to be replaced when worn out.

In some embodiments, mounting the chiplet to interposer 100 means that circuit elements in interposer 100 are coupled, via the connection points and signal routes, to circuit elements in interposer 100. In this way, a mounted chiplet is configured to interoperate with the circuit elements in interposer 100.

In some embodiments, a computing device uses code and/or data stored on a computer-readable storage medium to perform some or all of the operations herein described. More specifically, the computing device reads the code and/or data from the computer-readable storage medium and executes the code and/or uses the data when performing the described operations. For example, circuit elements in interposer 100 and/or one or more chiplets mounted on interposer 100 may use code and/or data stored in interposer 100 and/or the one or more chiplets to perform the operations described herein.

A computer-readable storage medium can be any device or medium or combination thereof that stores code and/or data for use by a computing device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs). In the described embodiments, the computer-readable storage medium does not include non-statutory computer-readable storage mediums such as transitory signals.

In some embodiments, one or more hardware modules are configured to perform the operations herein described. For example, the hardware modules can include, but are not limited to, one or more chiplets and/or interposer 100. When such hardware modules are activated, the hardware modules perform some or all of the operations. In some embodiments, the hardware modules include one or more general-purpose circuits that are configured by executing instructions (program code, firmware, etc.) to perform the operations.

In some embodiments, a data structure representative of some or all of the structures and mechanisms described herein (e.g., interposer 100 and/or some portion thereof) is stored on a computer-readable storage medium that includes a database or other data structure which can be read by a computing device and used, directly or indirectly, to fabricate hardware comprising the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates/circuit elements from a synthesis library that represent the functionality of the hardware comprising the above-described structures and mechanisms. The netlist may then be placed and routed to produce a data set describing geometric shapes to be applied to masks. The masks may then be used in various semiconductor fabrication steps to produce a semiconductor circuit or circuits corresponding to the above-described structures and mechanisms. Alternatively, the database on the computer accessible storage medium may be the netlist (with or without the synthesis library) or the data set, as desired, or Graphic Data System (GDS) II data.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An interposer, comprising:
    a substrate;
    a plurality of sites arranged in a pattern on the substrate, each site comprising a set of connection points, wherein the set of connection points in each of the sites is arranged in a same layout so that a matching layout of the set of connection points is repeated in each of the sites; and
    one or more signal routes in the substrate, wherein each of the connection points in each of the sites is coupled to a corresponding one of the one or more signal routes in the substrate, and wherein a same signal route is coupled between corresponding connection points in at least two sites of the plurality of sites.

2. The interposer of claim 1, wherein each connection point in a same physical location in each of the sites is coupled to a same type of signal route.

3. The interposer of claim 1, further comprising a chiplet coupled to one or more of the sites, the chiplet comprising an element to be mounted to the interposer.

4. The interposer of claim 3, wherein the chiplet comprises one or more signal connectors, and wherein the one or more signal connectors are coupled to at least some of the connection points of the one or more of the sites.

5. The interposer of claim 1, wherein each of the sites is a same physical size and shape.

6. The interposer of claim 1, wherein the set of connection points in each of the sites comprises one or more of:
    mechanical connectors; and
    electromagnetic connectors.

7. The interposer of claim 1, wherein the one or more signal routes in the substrate comprise one or more of:
    communication signal routes;
    power signal routes; and
    control signal routes.

8. The interposer of claim 1, further comprising:
    one or more circuit elements in the substrate, the one or more circuit elements coupled to one or more of the signal routes in the substrate and configured to interact with signals on the one or more of the signal routes.

9. A method for manufacturing an interposer, comprising:
    forming a substrate, including forming one or more signal routes in the substrate;
    forming a plurality of sites arranged in a pattern on the substrate; and
    forming a set of connection points in each of the sites, wherein forming the set of connection points in each of the sites comprises forming connection points arranged in one of two or more different layouts, so that matching layouts of the set of connection points are repeated in two or more subsets of the sites, wherein each of the connection points in each of the sites having a same layout is coupled to a corresponding one of the one or more signal routes in the substrate, and wherein a same signal route is coupled between corresponding connection points in at least two sites of the plurality of sites.

10. The method of claim 9, further comprising:
    physically coupling each connection point in a same physical location in each of the sites having a same layout and a same type of signal route.

11. The method of claim 9, further comprising:
    forming one or more circuit elements in the substrate, the forming comprising coupling the one or more circuit elements to one or more of the signal routes.

12. A method for mounting a chiplet to an interposer, the chiplet comprising an element to be mounted to the interposer, the method comprising:
    mounting the chiplet to one or more of a plurality of sites arranged in a pattern on a surface of the interposer, each of the sites comprising a set of connection points coupled to one or more signal routes in the substrate, the set of connection points in each of the sites being arranged in one of two or more different layouts so that matching layouts of the set of connection points are repeated in two or more subsets of the sites, and a same signal route coupled between corresponding connection points in at least two sites having a same layout among the plurality of sites.

13. The method of claim 12, wherein the chiplet comprises one or more signal connectors, and wherein mounting the chiplet comprises coupling the one or more signal connectors for the chiplet to least some of the connection points of the one or more sites.

14. The method of claim 13, wherein the interposer comprises one or more circuit elements coupled to at least some of the connection points of the one or more sites, and wherein coupling the one or more signal connectors comprises coupling one or more corresponding circuits in the chiplet to the one or more circuit elements.

15. An interposer, comprising:
    a substrate;
    a plurality of sites arranged in a pattern on the substrate, each site comprising a set of connection points, wherein the set of connection points in each of the sites is arranged in one of two or more different layouts so that matching layouts of the set of connection points are repeated in two or more subsets of the sites; and
    one or more signal routes in the substrate, wherein each of the connection points in each of the sites is coupled to a corresponding one of the one or more signal routes in the substrate, and wherein a same signal route is coupled between corresponding connection points in at least two sites of the plurality of sites.

16. The interposer of claim 15, wherein each connection point in a same physical location in each of the sites having a same layout is coupled to a same type of signal route.

17. The interposer of claim 15, further comprising a chiplet coupled to one or more of the sites, the chiplet comprising an element to be mounted to the interposer.

18. The interposer of claim 15, further comprising:
    one or more circuit elements in the substrate, the one or more circuit elements coupled to one or more of the signal routes in the substrate and configured to interact with signals on the one or more of the signal routes.

* * * * *